US010886702B2

(12) United States Patent
Hatzilias et al.

(10) Patent No.: US 10,886,702 B2
(45) Date of Patent: Jan. 5, 2021

(54) VERTICAL-CAVITY SURFACE-EMITTING LASER FOR NEAR-FIELD ILLUMINATION OF AN EYE

(71) Applicant: Facebook Technologies, LLC, Menlo Park, CA (US)

(72) Inventors: Karol Constantine Hatzilias, Kenmore, WA (US); Christopher Yuan-Ting Liao, Seattle, WA (US); Robin Sharma, Redmond, WA (US); Gregory Olegovic Andreev, Kirkland, WA (US); Paul Armen Tchertchian, Fremont, CA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/517,186

(22) Filed: Jul. 19, 2019

(65) Prior Publication Data

US 2020/0153204 A1 May 14, 2020

Related U.S. Application Data

(60) Provisional application No. 62/758,459, filed on Nov. 9, 2018, provisional application No. 62/858,858, filed on Jun. 7, 2019.

(51) Int. Cl.
*H01S 5/183* (2006.01)
*G02B 27/01* (2006.01)
(Continued)

(52) U.S. Cl.
CPC ...... *H01S 5/18394* (2013.01); *G02B 27/0172* (2013.01); *G02B 27/0179* (2013.01);
(Continued)

(58) Field of Classification Search
CPC ............ H01S 5/0425; H01S 5/18344; H01S 5/18361; H01S 5/0206; H01S 5/18394;
(Continued)

(56) References Cited

U.S. PATENT DOCUMENTS 6,014,400 A * 1/2000 Kobayashi ............. B82Y 20/00
372/46.013
6,542,530 B1 * 4/2003 Shieh ................. H01S 5/04256
372/46.01

(Continued)

FOREIGN PATENT DOCUMENTS

WO 2018133084 A1 7/2018
WO WO 2018133084 * 7/2018
(Continued)

OTHER PUBLICATIONS

International Searching Authority, Patent Cooperation Treaty, European Application No. PCT/US2019/059060, dated Apr. 21, 2020, 16 pages.
(Continued)

*Primary Examiner* — Tuan N Nguyen
(74) *Attorney, Agent, or Firm* — Freestone Intellectual Property Law PLLC; Aaron J. Visbeek; Andrew J. Cameron

(57) ABSTRACT

A vertical-cavity surface-emitting laser for near-field illumination of an eye includes a semiconductor substrate, a first reflector, a mesa region, a first electrical contact, and a second electrical contact. The first reflector is disposed on a first side of the semiconductor substrate and the mesa region is disposed on the first reflector. The mesa region includes a second reflector and an active region, where the mesa region is configured to generate a diverging infrared beam. The first electrical contact is disposed on a second side of the semiconductor substrate, opposite the first side, for electrically coupling to the first reflector. The second electrical contact (Continued)

is also disposed on the second side of the semiconductor substrate for electrically coupling to the second reflector.

17 Claims, 5 Drawing Sheets

(51) Int. Cl.
*H01S 5/042* (2006.01)
*H01S 5/42* (2006.01)
*H01S 5/02* (2006.01)
*G06F 3/01* (2006.01)

(52) U.S. Cl.
CPC ............ *G06F 3/013* (2013.01); *H01S 5/0425* (2013.01); *H01S 5/18344* (2013.01); *H01S 5/18361* (2013.01); *H01S 5/423* (2013.01); *G02B 2027/0178* (2013.01); *G02B 2027/0187* (2013.01); *H01S 5/0206* (2013.01)

(58) Field of Classification Search
CPC ............ H01S 5/18388; H01S 5/18347; H01S 5/18386; H01S 5/04257; H01S 5/18308
USPC ...................................... 372/50.12
See application file for complete search history.

(56) References Cited

U.S. PATENT DOCUMENTS

| | | | |
|---|---|---|---|
| 2003/0235226 A1* | 12/2003 | Ueki | H01S 5/18394 372/46.01 |
| 2016/0295202 A1* | 10/2016 | Evans | G02B 3/14 |
| 2018/0008141 A1* | 1/2018 | Krueger | A61B 5/11 |
| 2018/0239145 A1* | 8/2018 | Lanman | G02B 27/0172 |
| 2018/0278924 A1* | 9/2018 | Schowengerdt | G02B 27/0093 |
| 2019/0018485 A1* | 1/2019 | Aleem | G02B 27/0172 |
| 2019/0056599 A1* | 2/2019 | Reshidko | G02B 27/0179 |
| 2019/0101978 A1* | 4/2019 | Iseringhausen | G06F 1/163 |

FOREIGN PATENT DOCUMENTS

WO        2018147963 A1    8/2018
WO    WO 2018147963   *   8/2018

OTHER PUBLICATIONS

International Searching Authority, Patent Cooperation Treaty, European Application No. PCT/US2019/059060, dated Jun. 29, 2020, 19 pages.

* cited by examiner

VERTICAL-CAVITY SURFACE-EMITTING LASER FOR NEAR-FIELD ILLUMINATION OF AN EYE

CROSS-REFERENCE TO RELATED APPLICATION

The present application claims the benefit of U.S. Provisional Application No. 62/758,459, entitled "VCSEL CONFIGURED FOR EYE-TRACKING" filed Nov. 9, 2018, and of U.S. Provisional Application No. 62/858,858, entitled "VERTICAL-CAVITY SURFACE-EMITTING LASER (VCSEL) FOR NEAR-FIELD ILLUMINATION OF AN EYE" filed Jun. 7, 2019. U.S. Provisional Application Nos. 62/758,459 and 62/858,858 are expressly incorporated herein by reference in their entirety.

BACKGROUND

A head mounted device is a wearable electronic device, typically worn on the head of a user. Head mounted devices may include one or more electronic components for use in a variety of applications, such as gaming, aviation, engineering, medicine, entertainment, activity tracking, and so on. Some head mounted devices may perform eye-tracking which may enhance the user's viewing experience. Eye-tracking may be aided, in some cases, by illuminating the eye of the user. Thus, some conventional head mounted devices may incorporate an eye-tracking system that includes an illumination source as well as a camera for tracking movements of the user's eye.

In some instances, a vertical-cavity surface-emitting laser (VCSEL) may be utilized as the illumination source of the eye-tracking system. However, conventional VCSEL structures are typically designed for applications other than eye-tracking, such as for fiber optic communications and laser printers. The design requirements for these other applications often results in a VCSEL structure that is less than optimal or less effective when incorporated into an eye-tracking system.

BRIEF DESCRIPTION OF THE DRAWINGS

Non-limiting and non-exhaustive aspects of the present disclosure are described with reference to the following figures, wherein like reference numerals refer to like parts throughout the various views unless otherwise specified.

DETAILED DESCRIPTION

Various aspects and embodiments are disclosed in the following description and related drawings to show specific examples relating to vertical-cavity surface-emitting laser (VCSEL) for near-field illumination of an eye of a user of a head mounted device. Alternate aspects and embodiments will be apparent to those skilled in the pertinent art upon reading this disclosure and may be constructed and practiced without departing from the scope or spirit of the disclosure. Additionally, well-known elements will not be described in detail or may be omitted so as to not obscure the relevant details of the aspects and embodiments disclosed herein.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
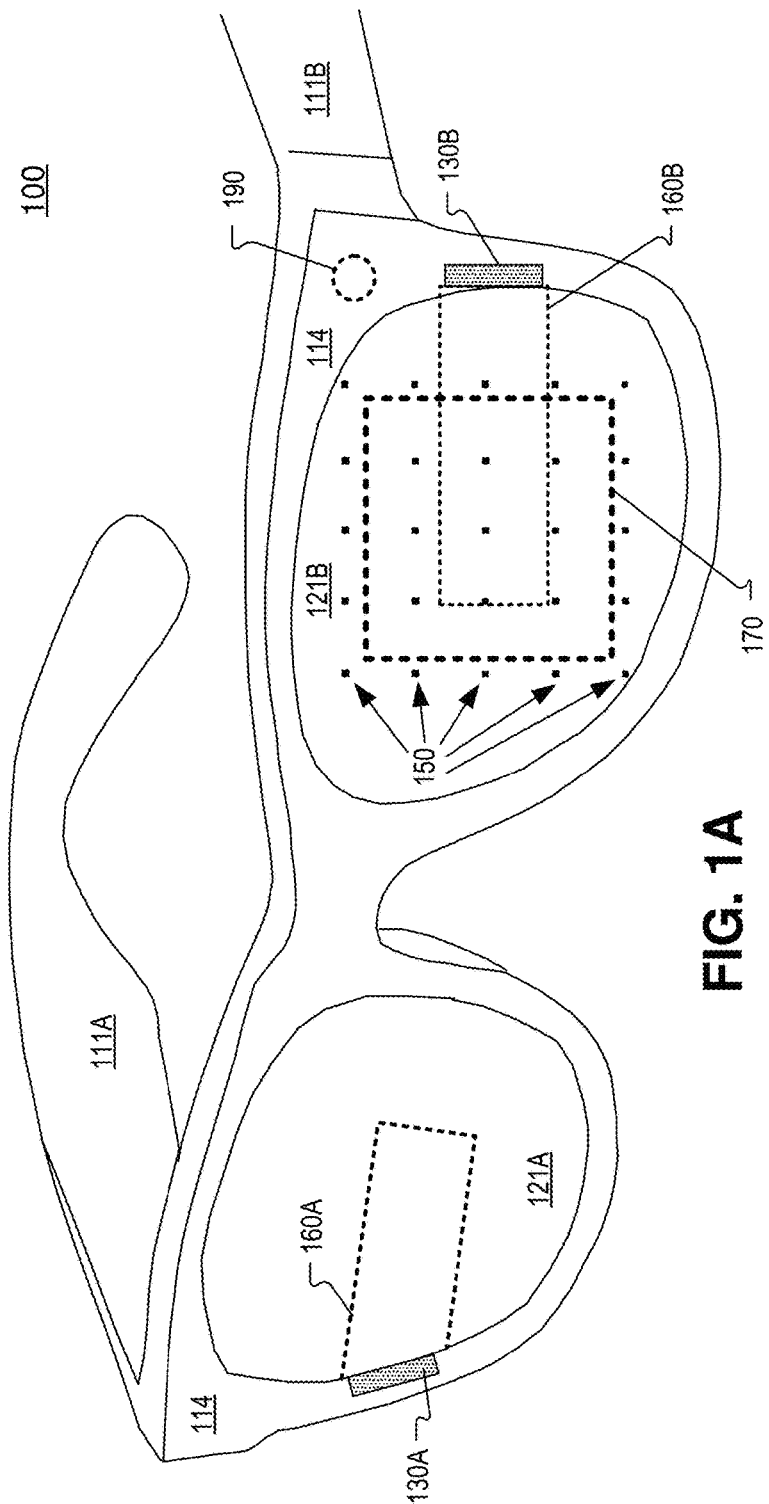
FIG. 1A illustrates a head mounted display (HMD), in accordance with aspects of the present disclosure.

FIG. 1A illustrates an example head mounted display (HMD) 100 that includes an array of VCSELs 150 emitting infrared light in an eyebox direction, in accordance with an embodiment of the disclosure. HMD 100 includes frame 114 coupled to arms 111A and 111B. Lenses 121A and 121B are mounted to frame 114. Lenses 121A and 121B may be prescription lenses matched to a particular wearer of HMD or non-prescription lenses.

An HMD, such as HMD 100 is one type of head mounted device, typically worn on the head of a user to provide artificial reality content to a user. Artificial reality is a form of reality that has been adjusted in some manner before presentation to the user, which may include, e.g., virtual reality (VR), augmented reality (AR), mixed reality (MR), hybrid reality, or some combination and/or derivative thereof.

In FIG. 1A, each lens 121A/121B includes a waveguide 160A/160B to direct image light generated by a display 130A/130B to an eyebox area for viewing by a wearer of HMD 100. Display 130A/130B may include an LCD, an organic light emitting diode (OLED) display, micro-LED display, quantum dot display, pico-projector, or liquid crystal on silicon (LCOS) display for directing image light to a wearer of HMD 100.

The frame 114 and arms 111A/111B of the HMD may include supporting hardware of HMD 100. HMD 100 may include any of processing logic, wired and/or wireless data interface for sending and receiving data, graphic processors, and one or more memories for storing data and computer-executable instructions. In one embodiment, HMD 100 may be configured to receive wired power. In one embodiment, HMD 100 is configured to be powered by one or more batteries. In one embodiment, HMD 100 may be configured to receive wired data including video data via a wired communication channel. In one embodiment, HMD 100 is configured to receive wireless data including video data via a wireless communication channel.

Lenses 121A/121B may appear transparent to a user to facilitate augmented reality or mixed reality where a user can view scene light from the environment around her while also receiving image light directed to her eye(s) by waveguide(s) 160. Lenses 121A/121B may include an optical combiner 170 for directing reflected infrared light (emitted by VCSELs 150) to an eye-tracking camera (e.g. camera 190). The array of VCSELs 150 may be disposed on a transparent substrate and could also be included advantageously in a VR headset where the transparent nature of the optical structure allows a user to view a display in the VR headset. In some embodiments of FIG. 1A, image light is only directed into one eye of the wearer of HMD 100. In an embodiment, both displays 130A and 130B are included to direct image light into waveguides 160A and 160B, respectively.

Lens 121B includes an array of VCSELs 150 arranged in an example 5×5 array. The VCSELs 150 in the array may be unevenly spaced, in some embodiments. VCSELs 150 may be infrared light sources directing their emitted light in an eyeward direction to an eyebox area of a wearer of HMD 100. VCSELs 150 may emit an infrared light having a wavelength of 850 nm or 940 nm, for example. Very small metal traces or transparent conductive layers (e.g. indium tin oxide) may run through lens 121B to facilitate selective illumination of each VCSEL 150. Lens 121A may be configured similarly to the illustrated lens 121B.

While VCSELs 150 may introduce occlusions into an optical system included in an HMD 100, VCSELs 150 and corresponding routing may be so small as to be unnoticeable or optically insignificant to a wearer of an HMD. Additionally, any occlusion from VCSELs 150 will be placed so close to the eye as to be unfocusable by the human eye and therefore assist in the VCSELs 150 being not noticeable. In addition to a wearer of HMD 100 noticing VCSELs 150, it may be preferable for an outside observer of HMD 100 to not notice VCSELs 150.

Figure 1B:
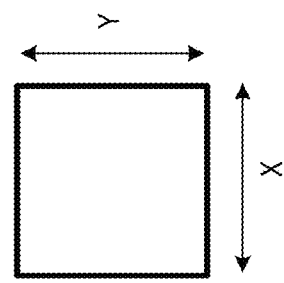
FIG. 1B illustrates a footprint of a vertical-cavity surface-emitting laser (VCSEL), in accordance with aspects of the present disclosure.

FIG. 1B illustrates a footprint of a VCSEL in accordance with embodiments of the disclosure. In some embodiments, each VCSEL 150 has a footprint where the "x" dimension is less than 125 microns and the "y" dimension is less than 125 microns. In some embodiments, each VCSEL 150 has a footprint where the "x" dimension is less than 75 microns and the "y" dimension is less than 75 microns. At these dimensions, the VCSELs 150 may not only be unnoticeable to a wearer of an HMD 100, the VCSELs 150 may be unnoticeable to an outside observer of HMD 100 at a distance that is outside of the user's personal space (0.45 m)

Figure 2:
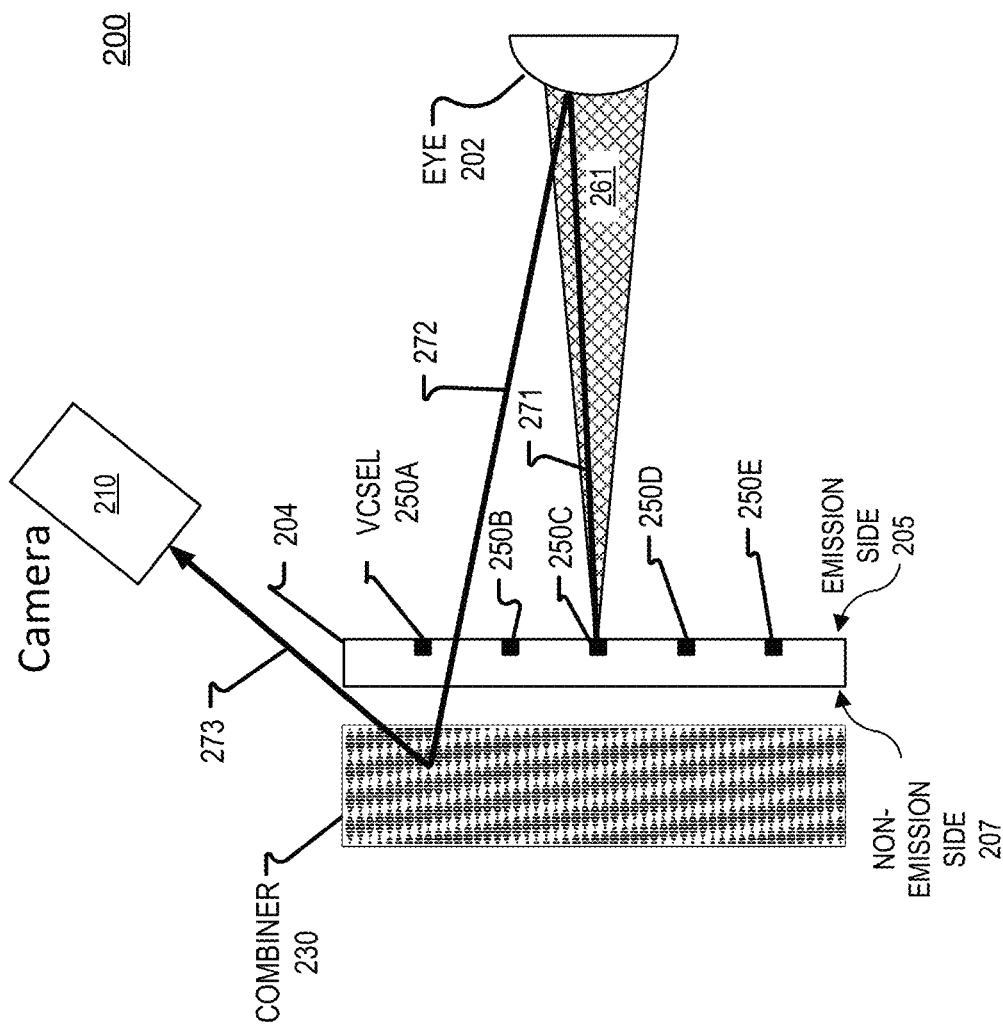
FIG. 2 illustrates an eye-tracking system, in accordance with aspects of the present disclosure.

FIG. 2 illustrates an eye-tracking system 200 that includes a side view of an array of VCSELs 250A-E illuminating an eyebox area, in accordance with an embodiment of the disclosure. The array of VCSELs includes VCSELs 250A, 250B, 250C, 250D, and 250E, in the illustrated embodiment. As shown in FIG. 2, the array of VCSELs 250A-250C are disposed on a transparent substrate 204 that includes an emission side 205 and a non-emission side 207. In the illustrated example, the emission side 205 is opposite the non-emission side 207, where the emission side is the side from which the VCSELs 250A-250C emit infrared light. For example, VCSEL 250C illuminates eye 202 with infrared beam 261. In some examples, infrared beam 261 is a diverging infrared beam. VCSELs 250A, 250B, 250D, and 250E may also illuminate eye 202 with respective infrared beams (not illustrated). Infrared light emitted by VCSEL 250C propagates along optical path 271 and reflects off eye 202 propagating along optical path 272. The infrared light propagating along optical path 272 travels through transparent substrate 204 and encounters optical combiner 230. Optical combiner 230 directs the infrared light to camera 210 along optical path 273. Optical combiner 230 may be a holographic combiner or Fresnel combiner. Optical combiner 230 may transmit visible light while reflecting or diffracting infrared light. Therefore, eye-tracking system 200 shows how VCSELs 250A-E may perform near-eye illumination by illuminating eye 202 with infrared light and how camera 210 may capture infrared images of eye 202 by capturing the infrared light. In some aspects, each of the VCSELs 250A-E are configured to generate infrared light for illuminating the eye 202 at distance of less than 25 mm from the eye 202.

In some embodiments, camera 210 may be configured with a bandpass filter that accepts a narrow-band infrared light that is the same as the narrow-band emitted by VCSELs 250A-E while the filter rejects other wavelengths. For example, VCSELs 250A-E may emit narrow-band infrared light centered around 940 nm while camera 210 may include a filter that accepts infrared light around 940 nm while rejecting other light wavelengths.

Figure 3:
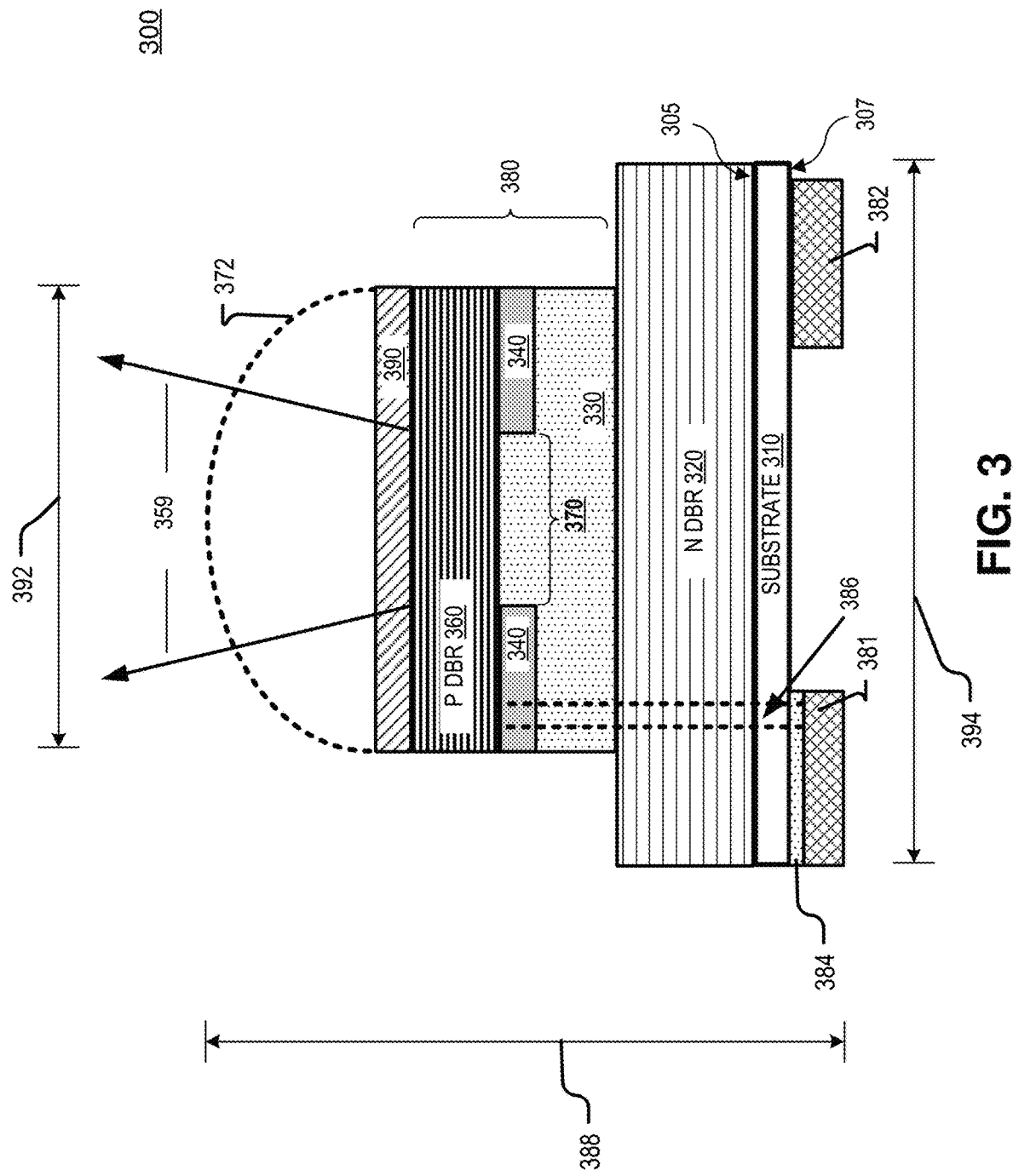
FIG. 3 illustrates an example block diagram of a VCSEL structure, in accordance with aspects of the present disclosure.

FIG. 3 illustrates an example block diagram of VCSEL structure 300 having a semiconductor substrate 310, an N doped Distributed Bragg Reflector (DBR) 320, and a mesa region 380 that includes an active region 330, an aperture definition layer 340, and a P doped DBR 360. VCSEL structure 300 may be used as VCSELs 150/250. Structure 300 may also optionally include a polarization layer 390 and a wafer level optic 372. Polarization layer 390 may include a circular or linear polarizer, for example. Wafer level optic 372 may be a refractive element or a diffractive element (not illustrated). In some examples, wafer level optic 372 may be formed from a high index material such as Gallium arsenide (GaAs). Wafer level optic 372 may be configured to scatter, tilt and/or focus (e.g. converge or diverge) the infrared beam 359 that is generated by VCSEL structure 300. In the illustrated embodiment, infrared beam 359 is a diverging infrared beam, where wafer level optic 372 is configured to direct the diverging infrared beam 359 to illuminate the eye of the user (e.g., eye 202 of FIG. 2). In FIG. 3, semiconductor substrate 310 has been thinned to further reduce the size of VCSEL structure 300 to have a total thickness 388 of less than 125 microns. In one embodiment, the VCSEL structure 300 has a total thickness 388 of less than 100 microns. In conventional applications, a conventionally-sized VCSEL may have a sufficiently small structure for the application. However, in an eye-tracking application where the VCSEL is positioned in the field of view of a user, thinning semiconductor substrate 310 using known substrate thinning techniques may further reduce the size of VCSEL structure 300 to reduce the noticeability of the structure 300 by both wearers of an HMD and outside observers.

In FIG. 3, an electrical contact 382 facilitates the electrical connection with N-doped DBR 320 by way of semiconductor substrate 310. Semiconductor substrate 310 may be gallium arsenide (GaAs) in some embodiments. An electrical contact 381 facilitates the electrical connection with P-doped DBR 360. In some examples, an isolation layer 384 is disposed between the electrical contact 381 and the semiconductor substrate 310 to insulate the electrical contact 381 from making an electrical connection with N-doped DBR 320. In the illustrated embodiment, a through hole via 386 electrically couples P-doped DBR 360 with electrical contact 381. Through hole via 386 may include a dielectric layer surrounding a conductive cylinder (e.g. metal) so that the dielectric layer isolates the conductive cylinder from layers 320, 330, and 340.

Figure 4:
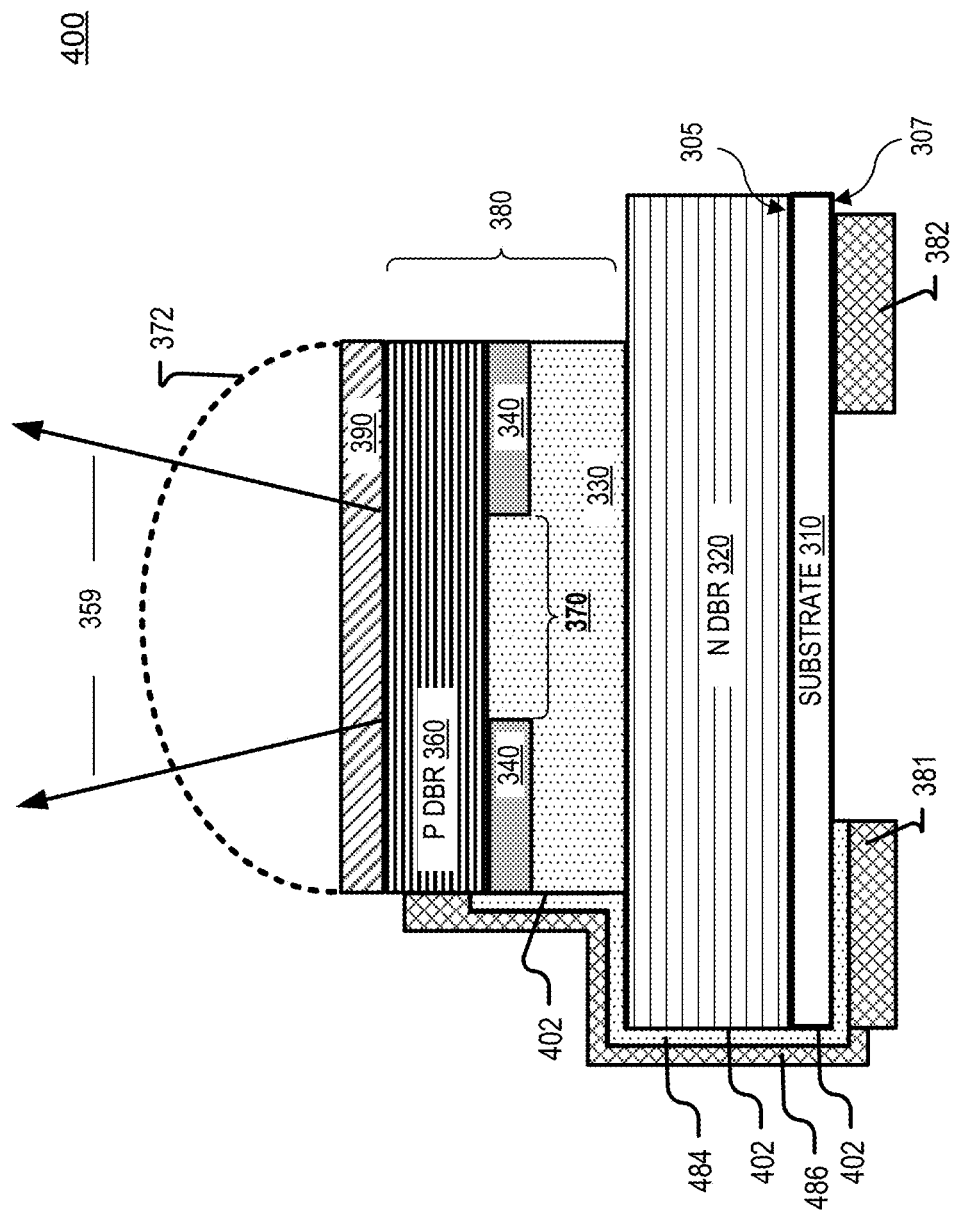
FIG. 4 illustrates an example block diagram of a VCSEL structure, in accordance with aspects of the present disclosure.

In another embodiment (shown in FIG. 4), an electrical connection between electrical contact 381 and P-doped DBR 360 may be established by disposing a conductive trace 486 on the outside of VCSEL structure 400 where the conductive trace 486 is isolated from layers 310, 320, 330, and 340 by an isolation layer 484 (e.g. dielectric). In particular, FIG. 4 illustrates an example of a VCSEL structure 400 that includes conductive trace 486 (e.g., deposited metal) for electrically connecting the electrical contact 381 to the P-doped DBR 360. FIG. 4 also illustrates the isolation layer 484 disposed between the semiconductor substrate 310 and the electrical contact 381 for electrically insulating the electrical contact 381 from the N-doped DBR 320. The isolation layer 484 is shown as further being disposed between the conductive trace 486 and a side-edge 402 of layers 310, 320, and 330.

In some examples, electrical contacts 381 and 382 of FIGS. 3 and 4 are configured to be disposed (e.g., mounted) on a transparent substrate, such as transparent substrate 204 of FIG. 2.

Conventional VCSEL structures are configured in a flip chip arrangement where the two contacts may be on the same side as the emission beam. Or, one contact may be disposed on the bottom of a conventional VCSEL structure while a second top contact allows for a wire bond to establish the second electrical connection. Notably, in the illustrated embodiments of FIGS. 3 and 4, the two contacts are arranged on one side of the VCSEL structure 300/400 that is opposite of the emission side of beam 359. For example, N-doped DBR 320 is shown as being disposed on a first side 305 of the semiconductor substrate 310, whereas both electrical contacts 381 and 382 are disposed on a second side 307 of the semiconductor substrate 310 (e.g., second side 307 is opposite the first side 305).

In different embodiments, VCSEL 300 and/or VCSEL 400 may be configured to generate a diverging infrared beam 359. In conventional applications of VCSELs, a narrow beam is desirable. For example, in telecommunication applications, a converging narrow beam assists to increase optical efficiency of fiber optic propagation where the VCSEL is coupled to the fiber optic. Thus, in some conventional applications, an optical element (e.g., wafer level lens) may be incorporated into the conventional VCSEL to produce a narrow or converging beam. However, in eye-tracking applications, the diverging beam may be advantageous to broadly illuminate an eye which is in the near-field (e.g. within 50 mm of the VCSEL). The epitaxial layer of the VCSEL structure 300/400 may be customized to achieve a broad emission cone, for example. The spacing of the P-doped DBR 360 with respect to the N-doped DBR 320 may be changed to manipulate the beam shape of beam 359, in some embodiments. In one embodiment, the aperture definition layer 340 may be adjusted to narrow or expand the aperture 370 to manipulate the beam shape of diverging infrared beam 359 to the desired diverging beam. In addition, the illustrated examples of VCSEL structure 300/400 are shown as including a wafer-level optic 372, which may be configured to direct the diverging infrared beam 359 to illuminate the eye of the user. That is, even with wafer level optic 372, the resultant light generated by the VCSEL structure 300/400 is diverging.

VCSEL structure 300/400 may be configured as a single mode emitter or a multi-mode emitter. In one embodiment, the width 392 of mesa region 380 is approximately 20 microns to generate a multi-mode emitter. In one embodiment, the width 392 of mesa region 380 is much narrower to generate a single mode emitter. In some examples, the width 394 of the VCSEL 300/400 is less than 75 microns, which provides a footprint of less than 75 microns by 75 microns.

Figure 5:
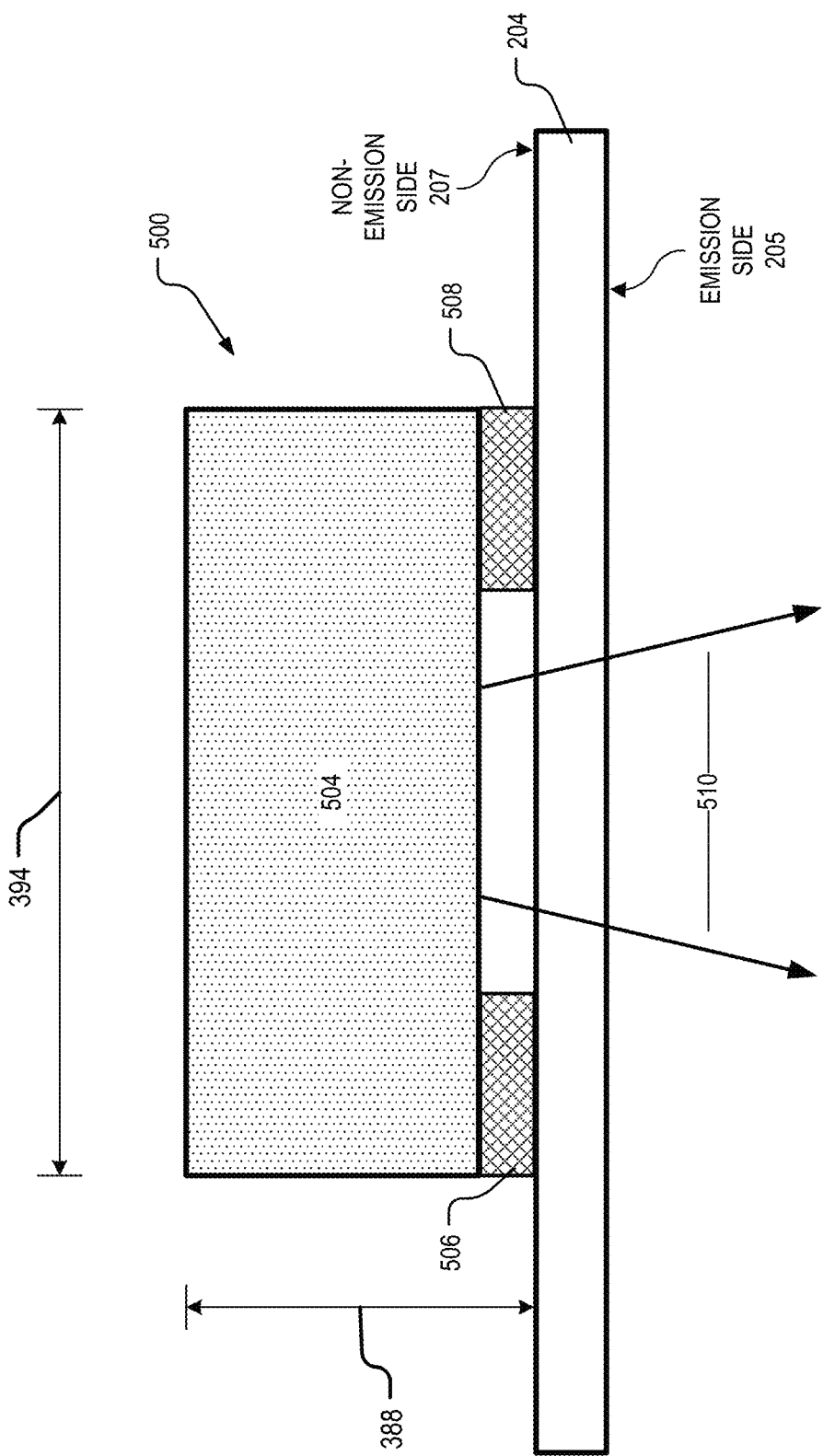
FIG. 5 illustrates an example block diagram of a VCSEL structure, in accordance with aspects of the present disclosure.

FIG. 5 illustrates an example block diagram of VCSEL structure 500 having a semiconductor structure 504 and electrical contacts 506 and 508. VCSEL structure 500 may be used as VCSELs 150/250. Semiconductor structure 504 may optically include one or more of a polarization layer, a wafer level optic, a Distributed Bragg Reflector (DBR), an aperture definition layer, a mesa region, an active region, a via, an isolation layer, a conductive trace, and the like. In some examples, semiconductor structure 504 is configured to generate a diverging infrared beam 510.

As shown in FIG. 5, the VCSEL structure 500 is disposed on the non-emission side 207 of the transparent substrate 204. In some aspects, the transparent substrate 204 is part of a near-eye optical element such as the lenses 121A/121B and/or the optical combiner 170 of FIG. 1A. Thus, in some examples, the semiconductor structure 504 is configured to generate the diverging infrared beam 510 through the transparent substrate 204 to the emission side 205 of the transparent substrate for near-field illumination of an eye of the user. In some implementations, near-field illumination includes the VCSEL structure 500 illuminating the eye of the user at distance of less than 25 mm from the eye.

FIG. 5 further illustrates VCSEL structure 500 as including electrical contacts 506/508 disposed between the semiconductor structure 504 and the transparent substrate 204. The electrical contacts 506/508 are disposed to electrically couple the semiconductor structure 504 to the non-emission side 207 of the transparent substrate 204.

In some aspects, the VCSEL structure 500 has a total thickness 388 of less than 125 microns. In another embodiment, the VCSEL structure 300 has a total thickness 388 of less than 100 microns. In some embodiments, the VCSEL structure 500 has a width 394 that is less than 125 microns to provide a footprint that is less than 125 microns by 125 microns. In another embodiment, each VCSEL structure 500 has a width 394 that is less than 75 microns to provide a footprint that is less than 75 microns by 75 microns.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A vertical-cavity surface-emitting laser (VCSEL) for near-field illumination of an eye of a user of a head mounted device, the VCSEL comprising:
   a semiconductor substrate;
   a first reflector disposed on a first side of the semiconductor substrate;
   a mesa region disposed above the first reflector and configured to generate a diverging infrared beam, wherein the mesa region includes:
      a second reflector; and
      an active region disposed between the first reflector and the second reflector;
   a first electrical contact disposed on a second side of the semiconductor substrate, opposite the first side, for electrically coupling to the first reflector;
   a second electrical contact disposed on the second side of the semiconductor substrate for electrically coupling to the second reflector; and
   a through-hole via for electrically connecting the second electrical contact to the second reflector, wherein the through-hole via extends through the semiconductor substrate, the first reflector, and the active region.

2. The VCSEL of claim 1, further comprising an isolation layer disposed between the semiconductor substrate and the second electrical contact for electrically insulating the second electrical contact from the first reflector, wherein the through-hole via also extends through the isolation layer.

3. The VCSEL of claim 1, wherein the VCSEL has a footprint of less than 125 microns by 125 microns.

4. The VCSEL of claim 1, wherein the VCSEL is configured to generate infrared light for illuminating the eye of the user at distance of less than 25 mm from the eye.

5. The VCSEL of claim 1, wherein the semiconductor substrate is a thinned semiconductor substrate such that the VCSEL has a total thickness of less than 100 microns.

6. The VCSEL of claim 1, wherein the VCSEL is configured as a single-mode emitter or a multi-mode emitter.

7. The VCSEL of claim 1, wherein the mesa region further comprises an aperture definition layer configured to beam shape infrared light generated by the mesa region into the diverging infrared beam.

8. The VCSEL of claim 1, wherein
   the first reflector comprises a first distributed Bragg reflector (DBR); and
   the second reflector comprises a second DBR.

9. The VCSEL of claim 8, wherein
   the first DBR comprises an N doped DBR; and
   the second DBR comprises a P doped DBR.

10. The VCSEL of claim 1, further comprising a wafer level optic disposed on the mesa region to direct the diverging infrared beam to illuminate the eye of the user.

11. The VCSEL of claim 10, wherein the wafer level optic is formed from a high index Gallium arsenide (GaAs).

12. An eye-tracking system of a head mounted device, the eye-tracking system comprising:
   a transparent substrate; and
   an array of vertical-cavity surface-emitting lasers (VCSELs) disposed on the transparent substrate within a field of view of a user of the head mounted device, wherein each VCSEL comprises:
      a semiconductor substrate;
      a first reflector disposed on a first side of the semiconductor substrate;
      a mesa region disposed above the first reflector and configured to generate a diverging infrared beam for near-field illumination of an eye of the user, wherein the mesa region includes:
         a second reflector; and
         an active region disposed between the first reflector and the second reflector;
      a first electrical contact disposed on a second side of the semiconductor substrate, opposite the first side, for electrically coupling the first reflector to the transparent substrate;
      a second electrical contact disposed on the second side of the semiconductor substrate for electrically coupling the second reflector to the transparent substrate; and
      a through-hole via for electrically connecting the second electrical contact to the second reflector, wherein the through-hole via extends through the semiconductor substrate, the first reflector, and the active region.

13. The eye-tracking system of claim 12, wherein each VCSEL further comprises an isolation layer disposed between the semiconductor substrate and the second electrical contact for electrically insulating the second electrical contact from the first reflector, wherein the through-hole via also extends through the isolation layer.

14. The eye-tracking system of claim 12, wherein each VCSEL has a footprint of less than 125 microns by 125 microns.

15. An eye-tracking system of a head mounted device, the eye-tracking system comprising:
   a transparent substrate of a near-eye optical element, the transparent substrate having an emission side and a non-emission side;
   an array of vertical-cavity surface-emitting lasers (VCSELs) disposed on the non-emission side of the transparent substrate within a field of view of a user of the head mounted device, wherein each VCSEL comprises:
      a semiconductor structure configured to generate a diverging infrared beam through the transparent substrate to the emission side of the transparent substrate for near-field illumination of an eye of the user, wherein the semiconductor structure includes a wafer level optic, formed from a high index Gallium arsenide (GaAs), to direct the diverging infrared beam to illuminate the eye of the user;
      a first electrical contact disposed on the semiconductor structure for electrically coupling the semiconductor structure to the non-emission side of the transparent substrate; and
      a second electrical contact disposed on the semiconductor structure for electrically coupling the semiconductor structure to the non-emission side of the transparent substrate.

16. The eye-tracking system of claim 15, wherein each VCSEL has a total thickness of less than 100 microns.

17. The eye-tracking system of claim 15, wherein each VCSEL has a footprint of less than 125 microns by 125 microns.

* * * * *